United States Patent
Matsuo

(10) Patent No.: US 8,616,787 B2
(45) Date of Patent: Dec. 31, 2013

(54) OPTICAL CONNECTOR AND MANUFACTURING METHOD THEREOF

(75) Inventor: Wataru Matsuo, Susono (JP)

(73) Assignee: Yazaki Corporation, Tokyo (JP)

( * ) Notice: Subject to any disclaimer, the term of this patent is extended or adjusted under 35 U.S.C. 154(b) by 213 days.

(21) Appl. No.: 13/056,582

(22) PCT Filed: Jul. 30, 2009

(86) PCT No.: PCT/JP2009/063899
§ 371 (c)(1),
(2), (4) Date: Jan. 28, 2011

(87) PCT Pub. No.: WO2010/013841
PCT Pub. Date: Feb. 4, 2010

(65) Prior Publication Data
US 2011/0176781 A1    Jul. 21, 2011

(30) Foreign Application Priority Data
Jul. 30, 2008   (JP) .................. P2008-196284

(51) Int. Cl.
*G02B 6/42* (2006.01)
(52) U.S. Cl.
USPC .................. 385/93; 385/89; 385/92
(58) Field of Classification Search
None
See application file for complete search history.

(56) References Cited

U.S. PATENT DOCUMENTS

| | | | |
|---|---|---|---|
| 4,539,476 A | | 9/1985 | Donuma et al. |
| 5,113,466 A | * | 5/1992 | Acarlar et al. ............. 385/88 |
| 5,233,676 A | * | 8/1993 | Yonemura et al. ............. 385/88 |
| 6,015,239 A | * | 1/2000 | Moore ............................. 385/92 |
| 6,497,517 B1 | * | 12/2002 | Nakanishi et al. .............. 385/92 |
| 7,268,368 B1 | | 9/2007 | Knapp |
| 2002/0146208 A1 | | 10/2002 | Nakura et al. |
| 2003/0007748 A1 | | 1/2003 | Ide |
| 2003/0113072 A1 | * | 6/2003 | Ohe et al. ...................... 385/88 |
| 2007/0230965 A1 | | 10/2007 | Horio |

FOREIGN PATENT DOCUMENTS

| | | |
|---|---|---|
| EP | 0 053 482 A2 | 6/1982 |
| EP | 1 273 945 A2 | 1/2003 |
| JP | 57-91568 | 6/1982 |
| JP | S57-091568 | 6/1982 |
| JP | H02-228617 | 9/1990 |
| JP | H09-084162 | 3/1997 |
| JP | 2002-303766 | 10/2002 |
| JP | 2003-168805 | 6/2003 |
| JP | 2004-265987 | 9/2004 |

OTHER PUBLICATIONS

Written Opinion for PCT/JP2009/063899, international filing date Jul. 30, 2009.*

(Continued)

*Primary Examiner* — Mike Stahl
(74) *Attorney, Agent, or Firm* — Finnegan, Henderson, Farabow, Garrett & Dunner, L.L.P.

(57) ABSTRACT

An optical connector comprising a housing (11) including a bottom wall, a plurality of side walls each of which stands from the bottom wall, and an opening defined by the side walls; a metal lead (21) mounted on the bottom wall; a photoelectric conversion element (23) mounted on the metal lead (21); a resin case (26) covering the photoelectric conversion element (23); a lens (25) corresponding to the photoelectric conversion element (23) and provided on the resin case (26); and an electromagnetic shield (12) provided on the resin case (26) and including a first through hole (12*e*) from which the lens (25) is exposed.

15 Claims, 11 Drawing Sheets

(56) References Cited

OTHER PUBLICATIONS

"Fiber Optic Connector Identifier", The Fiber Optic Association—Tech Topics, downloaded from http://www.thefoa.org/tech/connID.htm on May 26, 2013.*

International Search Report from the European Patent Office for International Application No. PCT/JP2009/063899 (Mail date Jan. 19, 2010).

Office Action dated Apr. 9, 2013 for JP 2008-196284, Notification of Reasons for Refusal.

* cited by examiner

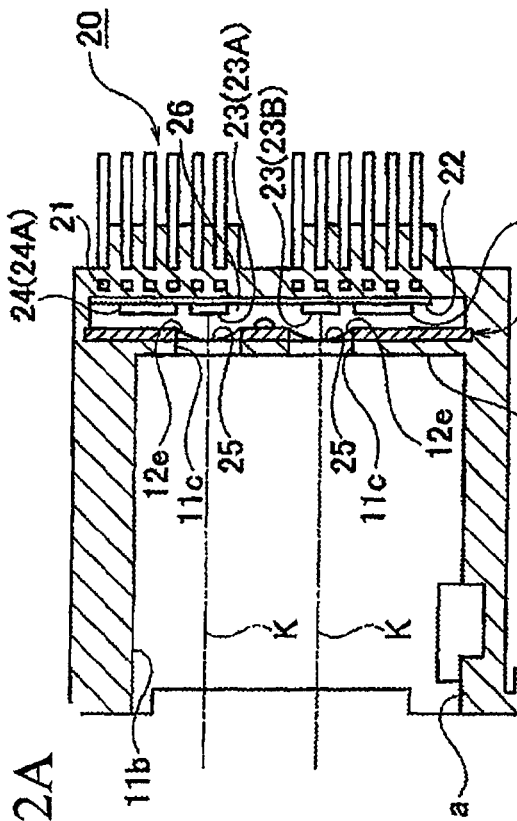

RELATED ART

OPTICAL CONNECTOR AND MANUFACTURING METHOD THEREOF

TECHNICAL FIELD

The present invention relates to a female optical connector of the field of optical communication, and especially to the female optical connector into which a male optical connector with an optical cable attached thereto is detachably inserted. Also, the present invention relates to a method of manufacturing the female optical connector.

BACKGROUND ART

In the field of optical communication, optical information which is obtained by photo-electrically converting large volumes of digital information is transmitted by optical cables at high speed. In this technology field, it is possible to hook up a plurality of electrical apparatuses with optical cables by connecting a male optical connector to a female optical connector. The male optical connector has a plug housing to which a optical cable is attached, and the female optical connector has a receptacle housing inside of which at least one photoelectric conversion element of a light-emitting element and a light-receiving element.

In the case where the light-emitting element is mounted in the photoelectric conversion element module inside the female optical connector, optical information emergent from the light-emitting element is transmitted to the optical cable side through the male optical connector. Meanwhile, in the case where the light-receiving element is mounted in the photoelectric conversion element module inside the female optical connector, optical information transmitted from the optical cable side is received by the light-receiving element through the male optical connector. In the case where the light-emitting element and the light-receiving element are mounted in the photoelectric conversion element module inside the female optical connector, optical information is transmitted and received.

As a female optical connector into which a male optical connector with an optical cable attached thereto is detachably inserted, there is an optical connector with improvements with respect to both electromagnetic noise shielding performance and radiation performance. (e.g., see JP-A-2002-303766).

FIG. 10 is an exploded perspective view of a related optical connector, and FIG. 11 is a vertical cross-sectional view of the related optical connector.

A related optical connector 100 shown in FIGS. 10 and 11 is disclosed in the aforementioned JP-A-2002-303766, and a brief description will be given with reference to JP-A-2002-303766.

As shown in FIGS. 10 and 11, the related optical connector 100 includes a photoelectric conversion element module 101, a metal shield case 110, a connector housing 120, and a metal shield cover 130.

Here, a description will be given for the aforementioned members 101, 110, 120, and 130 in this order. The photoelectric conversion element module 101 has a photoelectric conversion element 103 mounted in front of an element body portion 102 and a plurality of lead terminals 104 extending below the element body portion 102.

The metal shield case 110 is formed into a rectangular shape by using a metal plate for shielding electromagnetic noise by covering the photoelectric conversion element module 101. Further, the metal shield case 110 has a pin-like soldering portion 110a extending downward from the underside thereof.

The connector housing 120 is formed into a substantially rectangular shape by using an insulative resin material, and has on its front side an opening 120a into which a mating connector (not shown) is detachably inserted. A ferrule guiding portion 120b, into which a ferrule fitted to a leading end of an optical cable in the mating connector (not shown) is guided, is formed in the rear of the interior of this opening 120a (shown only in FIG. 11) in an annular shape in conformity with the photoelectric conversion element 103 of the photoelectric conversion element module 101. Further, a recess 120c for accommodating the metal shield case 110 which covers the photoelectric conversion element module 101 is formed in the rear of this ferrule guiding portion 120b, and a positioning fixing portion 120d extends downward from the underside of the connector housing 120.

In addition, the metal shield cover 130 is formed into a box shape with its front and lower sides open by using a metal plate, and has a plurality of pin-like soldering portions 130a extending downward from the underside of the metal shield cover 130. The metal shield cover 130 is in contact with the rear side portion of the metal shield case 110 which is exposed to outside the connector housing 120, and the metal shield cover 130 shields electromagnetic noise by covering the outer sides of the connector housing 120, and radiates heat generated in the photoelectric conversion element 103 to the outside through the metal shield case 110.

Further, after the photoelectric conversion element module 101 is covered by the metal shield case 110, this metal shield case 110 is accommodated into the recess 120c from the rear side of the connector housing 120. After the connector housing 120 is covered by the metal shield cover 130, the optical connector 100 is mounted on a mounting board P, the soldering portion 110a of the metal shield case 110 and the soldering portions 130a of the metal shield cover 130 are soldered on the back side of the mounting board P.

It is described in the JP-A-2002-303766 that, according to the above-described related optical connector 100 of above configuration, the photoelectric conversion element module 101 is shielded from electromagnetic noise doubly by both the metal shield case 110 and the metal shield cover 130, and the heat generated in the photoelectric conversion element 103 is radiated to the outside through the metal shield case 110.

Citation List

Patent Literature

PLT1: JP-A-2002-303766

Summary Of Invention

Technical Problem

With the above-described related optical connector 100, the photoelectric conversion element module 101, the metal shield case 110, the connector housing 120, and the metal shield cover 130 are respectively fabricated separately, and these component members 101, 110, 120, and 130 are assembled, so that the assembling man-hours disadvantageously increases. Hence, the related optical connector 100 has been expensive.

In addition, with the above-described related optical connector 100, although the photoelectric conversion element module 101 can be reliably shielded from electromagnetic noise by both the metal shield case 110 and the metal shield cover 130, the both members 110 and 130 require sheet metal bending in conformity with the outer configurations of the photoelectric conversion element module 101 and the connector housing 120. Hence, a problem also arises in that the manufacturing cost of the both members 110 and 130 disadvantageously becomes high.

Accordingly, an object of the invention is to provide a female optical connector and a method of manufacturing a female optical connector which are capable of shielding the photoelectric conversion element module from electromagnetic noise by a simple structure and of improving production efficiency by reducing the assembling manhour.

Solution to Problem

According to one or more illustrative aspects of the present invention, there is provided an optical connector comprising a housing including a bottom wall, a plurality of side walls each of which stands from the bottom wall, and an opening defined by the side walls; a metal lead provided on the bottom wall; a photoelectric conversion element mounted on the metal lead; a resin case covering the photoelectric conversion element; a lens corresponding to the photoelectric conversion element and provided on the resin case; and an electromagnetic shield provided on the resin case and including a first through hole from which the lens is exposed.

Preferably, the housing includes a partition wall which is parallel to the bottom wall and has a second through hole corresponding to the first through hole.

Preferably, the electromagnetic shield is sandwiched by the resin case and the partition wall.

Preferably, the lens and resin case are integrally formed from a translucent resin.

Preferably, the photoelectric conversion element is at least one of a light-emitting element and a light-receiving element.

Preferably, an optical axis of the photoelectric conversion element and an optical axis of the lens are identical.

Preferably, the first through hole and the second through hole have a same shape.

In addition, according to one or more illustrative aspects of the invention, there is provided a method for manufacturing an optical connector comprising steps of: mounting a photoelectric conversion element on a metal lead frame; obtaining a photoelectric conversion module by molding a resin case for covering the photoelectric conversion element and a lens having an optical axis which is identical to an optical axis of the photoelectric conversion element from a translucent resin; mounting an electromagnetic shield on the resin case; forming a resin housing so as to bury the photoelectric conversion module therein.

Preferably, the photoelectric conversion element is at least one of a light-emitting element and a light-receiving element.

Advantageous Effects of Invention

According to the female optical connector and the method of manufacturing a female optical connector in accordance with the invention, since the photoelectric conversion element module is embedded on the rear side of the interior of the opening of the receptacle housing in the state in which the electromagnetic shield cover is superposed on the front side of the resin casing, the photoelectric conversion element can be reliably shielded from electromagnetic noise by the electromagnetic shield cover having a simple structure. In addition, the female optical connector with the photoelectric conversion element module embedded in the receptacle housing can be mounted as it is on a printed wiring board, for example. Therefore, it is possible to substantially reduce the assembling manhour of the female optical connector, thereby making it possible to contribute to the improvement of productivity.

Furthermore, since the lens having, for example, a convex surface is disposed in front of the photoelectric conversion element with its optical axis aligned with that of the photoelectric conversion element, it is possible to reliably effect at least one of transmission and reception of optical information.

BRIEF DESCRIPTION OF DRAWINGS

FIGS. 2A to 2C are a horizontal cross-sectional view, a front elevational View, and a vertical cross-sectional view illustrating the female optical connector in accordance with the invention.

DESCRIPTION OF EMBODIMENTS

Referring now to FIGS. 1 to 9, a detailed description will be given of an embodiment of a female optical connector and a method of manufacturing a female optical connector in accordance with the invention.

Example 1

Figure 1:
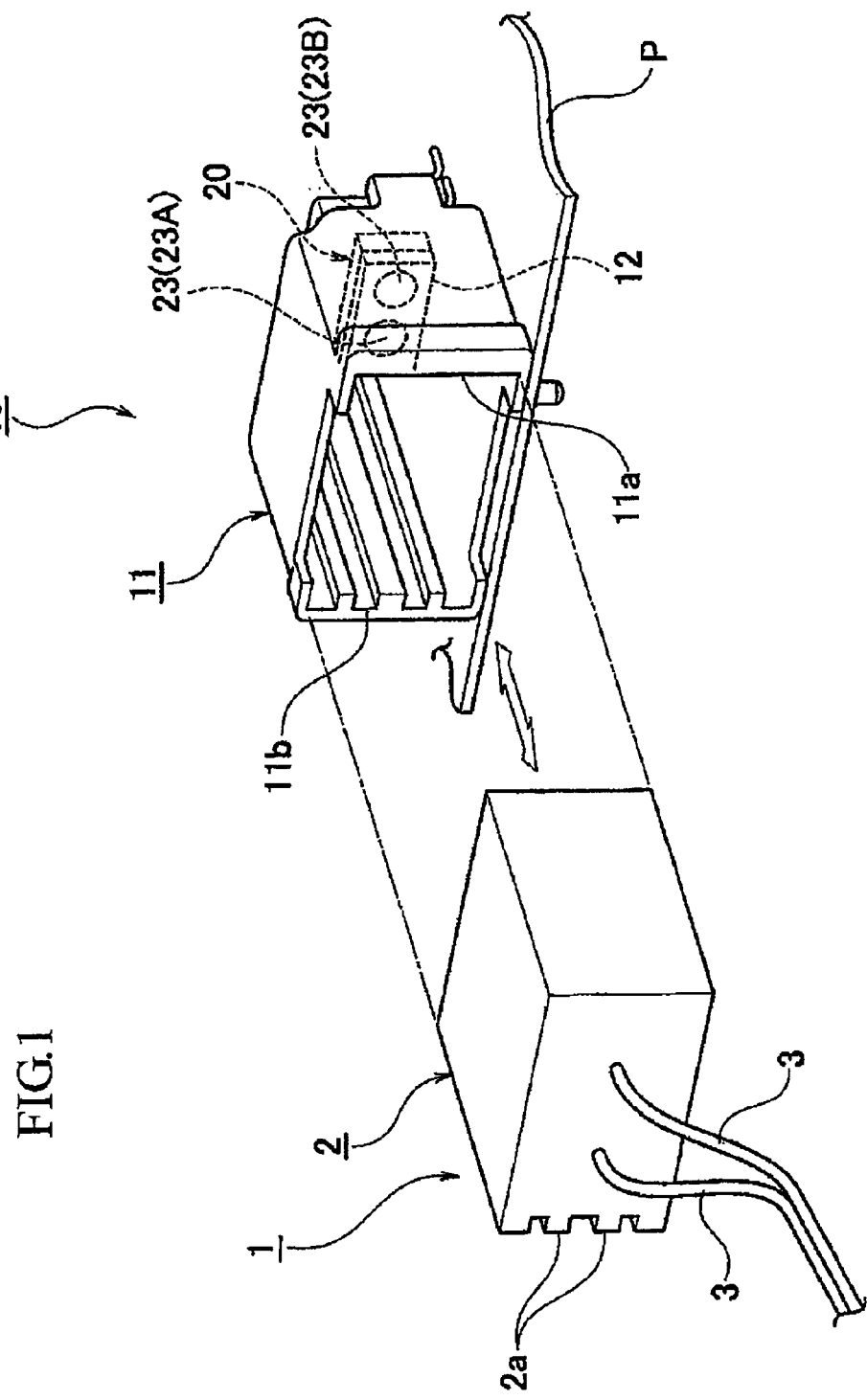
FIG. 1 is a perspective view illustrating a female optical connector in accordance with the invention and a mating male optical connector.

FIG. 1 is a perspective view illustrating a female optical connector in accordance with the invention and a mating male optical connector, and FIGS. 2A to 2C are a horizontal cross-sectional view, a front elevational view, and a vertical cross-sectional view illustrating the female optical connector in accordance with the invention.

As shown in FIG. 1, a female optical connector 10 in accordance with the invention is so configured as to be capable of effecting optical communication of large volumes of optical information among various electronic equipment via an optical cable 3 by being connected to a male optical connector 1 having a plug housing 2 with the optical cable 3 attached thereto.

With the above-described female optical connector 10 in accordance with the invention, an opening 11a having a rectangular shape is open on the front side of a receptacle housing 11 made of a resin and formed into the shape of a substantially rectangular parallelepiped, and the plug housing 2 of the mating male optical connector 1 is capable of being detachably inserted into this opening 11a in the direction of arrows.

At this juncture, the plug housing 2 of the male optical connector 1 is resin molded into a slightly smaller shape than the outer shape of the receptacle housing 11 in conformity with the shape of the opening 11a of the receptacle housing 11 of the female optical connector 10.

In addition, in the female optical connector 10, a guide portion 11b with a repetitive recessed and projecting pattern is formed on one inner side surface of the opening 11a of the receptacle housing 11, and a guide portion 2a with a recessed and projecting pattern is correspondingly formed on one outer side surface of the plug housing 2 of the male optical connector 1. The both guide portions 11b and 2a are formed by maintaining a complementary relation such that, when the guide portions 11b and 2a are opposed to each other, a recessed portion on one side is fitted to a projecting portion on the other side, and a projecting portion on one side is fitted to a recessed portion on the other side. Thus, a measure is provided for preventing erroneous insertion when the top and the bottom or the left and the right of the male optical connector 1 are inverted with respect to the female optical connector 10.

In addition, the female optical connector 10 in accordance with the invention is mounted on a printed wiring board P in a state in which an electromagnetic shield cover 12 and a photoelectric conversion element module 20 having at least one photoelectric conversion element 23 of a light-emitting element and a light-receiving element are embedded in a rear portion of the interior of the opening 11a of the receptacle housing 11.

In this embodiment, since a light-emitting element 23A and a light-receiving element 23B are incorporated in the photoelectric conversion element module 20 as the photoelectric conversion elements 23, transmission and reception are possible respectively independently via the two optical cables 3 attached to the male optical connector 1.

It should be noted that the above-described photoelectric conversion element module 20 is also called a fiber optic transceiver (FOT).

Here, a specific description will be given of the above-described female optical connector 10 in accordance with the invention with reference to FIGS. 2A to 2C.

First, in the photoelectric conversion element module 20 which is embedded in the female optical connector 10, the photoelectric conversion elements 23 (23A and 23B) and element driving ICs 24 (24A and 24B) are respectively mounted on an electrically conductive metal lead frame 21 in a wire-bonded state. Further, a plurality of lead terminals 21c respectively extending from one side surface of the metal lead frame 21 and a plurality of lead terminals 21d extending from the opposite side surface opposing the one side surface of the metal lead frame 21 are adapted to be soldered to the printed wiring board P.

At this juncture, the photoelectric conversion element module 20 is sufficient if it has at least one photoelectric conversion element 23 of the light-emitting element and the light-receiving element. In this embodiment, however, the photoelectric conversion element module 20 has the light-emitting element 23A and the light-receiving element 23B juxtaposed side by side in a close proximity to each other with a predetermined interval provided therebetween in the left-right direction. In conjunction with this, the light-emitting element driving IC 24A and the light-receiving element driving IC 24B are respectively provided side by side with the left and right outer sides of the elements 23A and 23B.

Further, in the case where the light-emitting element 23A is used as the photoelectric conversion element 23, a light emitting diode (LED), a vertical cavity surface emitting laser (VCSEL), or the like is used as this light-emitting element 23A. Meanwhile, in the case where the light-receiving element 23B is used as the photoelectric conversion element 23, a light emitting diode (LED), a photo diode (PD) is used as this light-receiving element 23B.

In addition, the photoelectric conversion element module 20 is integrally formed as two lenses 25 and a resin case 26 for protecting the photoelectric conversion elements 23 (23A and 23B) and the element driving ICs 24 (24A and 24B) are primarily molded from a transparent resin material, as will be described later, the two lenses 25 being respectively disposed on front sides of the photoelectric conversion elements 23 (23A and 23B) in spaced-apart relation thereto with their optical axes K aligned with those of the photoelectric conversion elements 23 (23A and 23B) mounted on the metal lead frame 21.

Since the two lenses 25 are formed with convex surfaces so that their foci are respectively aligned with the optical axes of the light-emitting element 23A and the light-receiving element 23B, the two lenses 25 are adapted to be capable of reliably effecting the transmission and reception of optical information with respect to the optical cables 3 attached to the plug housing 2 of the male optical connector 1 shown in FIG. 1.

Further, the electromagnetic shield cover 12 having two light transmitting holes 12e for respectively facing the two lenses 25 is superposed on the front side of the resin case 26 of the photoelectric conversion element module 20. As an electrically conductive metal plate is used for the electromagnetic shield cover 12, the electromagnetic shield cover 12 reliably shields the photoelectric conversion elements 23 (23A and 23B) and the element driving ICs 24 (24A and 24B) from electromagnetic noise.

The electromagnetic shield cover 12 is formed in a size capable of covering the front side of the resin case 26 of the photoelectric conversion element module 20, and terminals 12c and 12d (shown in FIG. 6) for soldering to the printed wiring board P extend from one and the other sides of the electromagnetic shield cover 12.

Next, the receptacle housing 11 which forms the outer appearance of the female optical connector 10 in accordance with this embodiment has a partition wall 11d which is suspendedly provided on the rear side of the interior of the opening 11a which is open on the front side. The partition wall 11d has a pair of light transmitting holes 11c for respectively facing the two lenses 25. Further, in the state in which the electromagnetic shield cover 12 is superposed on the rear side of this partition wall 11d on the front side of the resin case 26, the photoelectric conversion element module 20 is embedded by secondary molding using a transparent resin material.

A plurality of positioning bosses 11e are projectingly formed on the bottom side of the receptacle housing 11, and as these positioning bosses 11e are respectively inserted into a plurality of positioning holes (not shown) formed in the printed wiring board P, the female optical connector 10 is correctly positioned and mounted on the printed wiring board P.

According to the female optical connector 10 in accordance with the embodiment constructed as described above, since the photoelectric conversion element module 20 is embedded on the rear side of the interior of the opening 11a of the receptacle housing 11 in the state in which the electromagnetic shield cover 12 is superposed on the front side of the resin case 26, the photoelectric conversion elements 23 (23A and 23B) and the element driving ICs 24 (24A and 24B) are reliably shielded from electromagnetic noise by the electromagnetic shield cover 12 having a simple structure. In addition, the female optical connector 10 with the photoelectric conversion element module 20 embedded in the receptacle housing 11 is mounted as it is on the printed wiring board P, for example. Therefore, it is possible to substantially reduce the assembling man-hours of the female optical connector 10, thereby making it possible to contribute to the improvement of productivity.

Furthermore, since the lens 25 having, for example, a convex surface is disposed in front of the photoelectric conversion element 23 (23A, 23B) with its optical axis K aligned with that of the photoelectric conversion element 23 (23A, 23B), it is possible to reliably effect at least one of transmission and reception of optical information.

Next, referring to FIGS. 3A to 9, a description will be given of the method of manufacturing the female optical connector 10 in accordance with the invention in the order of steps.

Figures 3A, 3B:
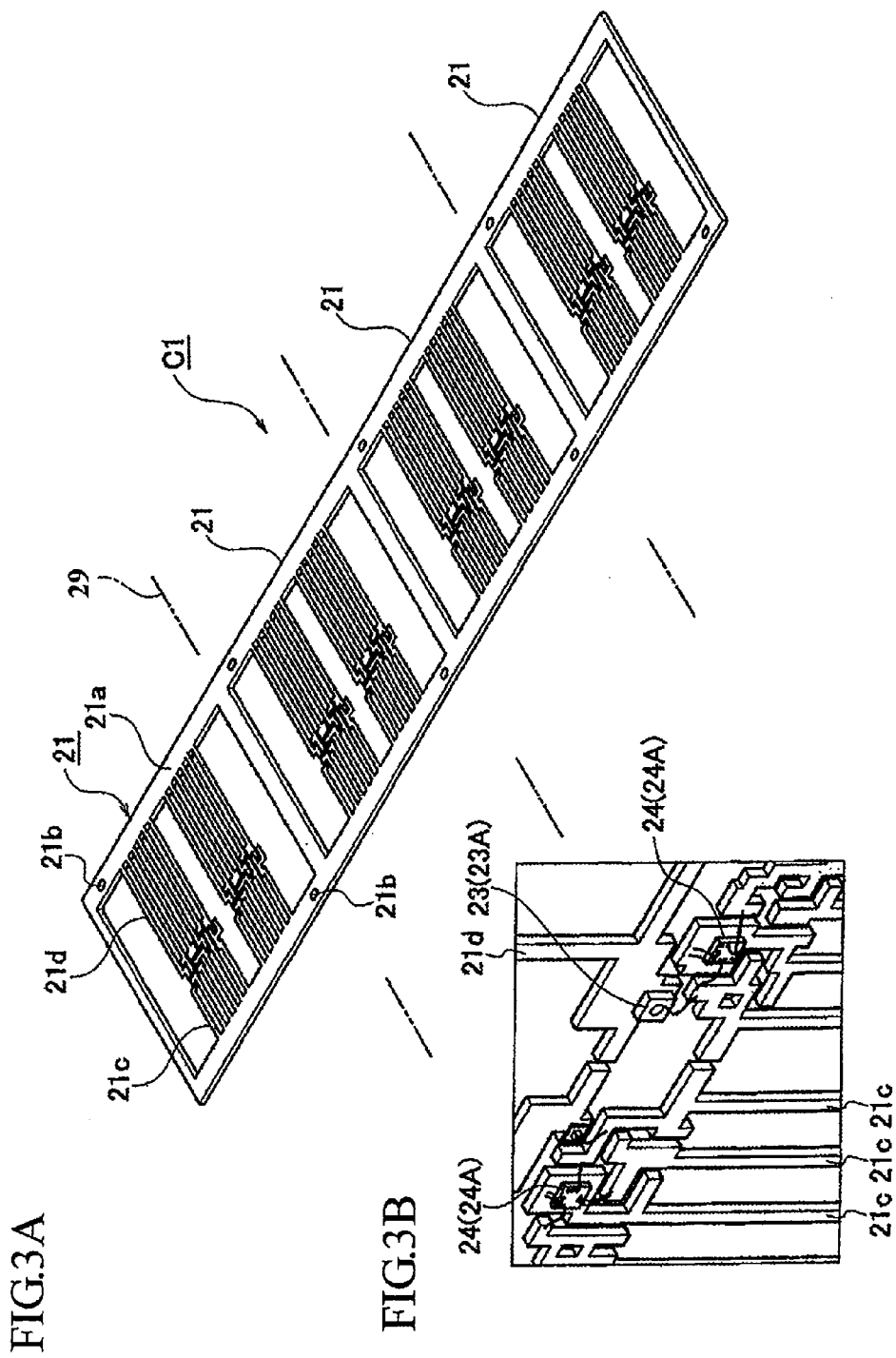
FIGS. 3A and 3B are perspective views illustrating a first step for mounting photoelectric conversion elements and driving ICs on each metal lead frame through a wiring board.
Figure 4:
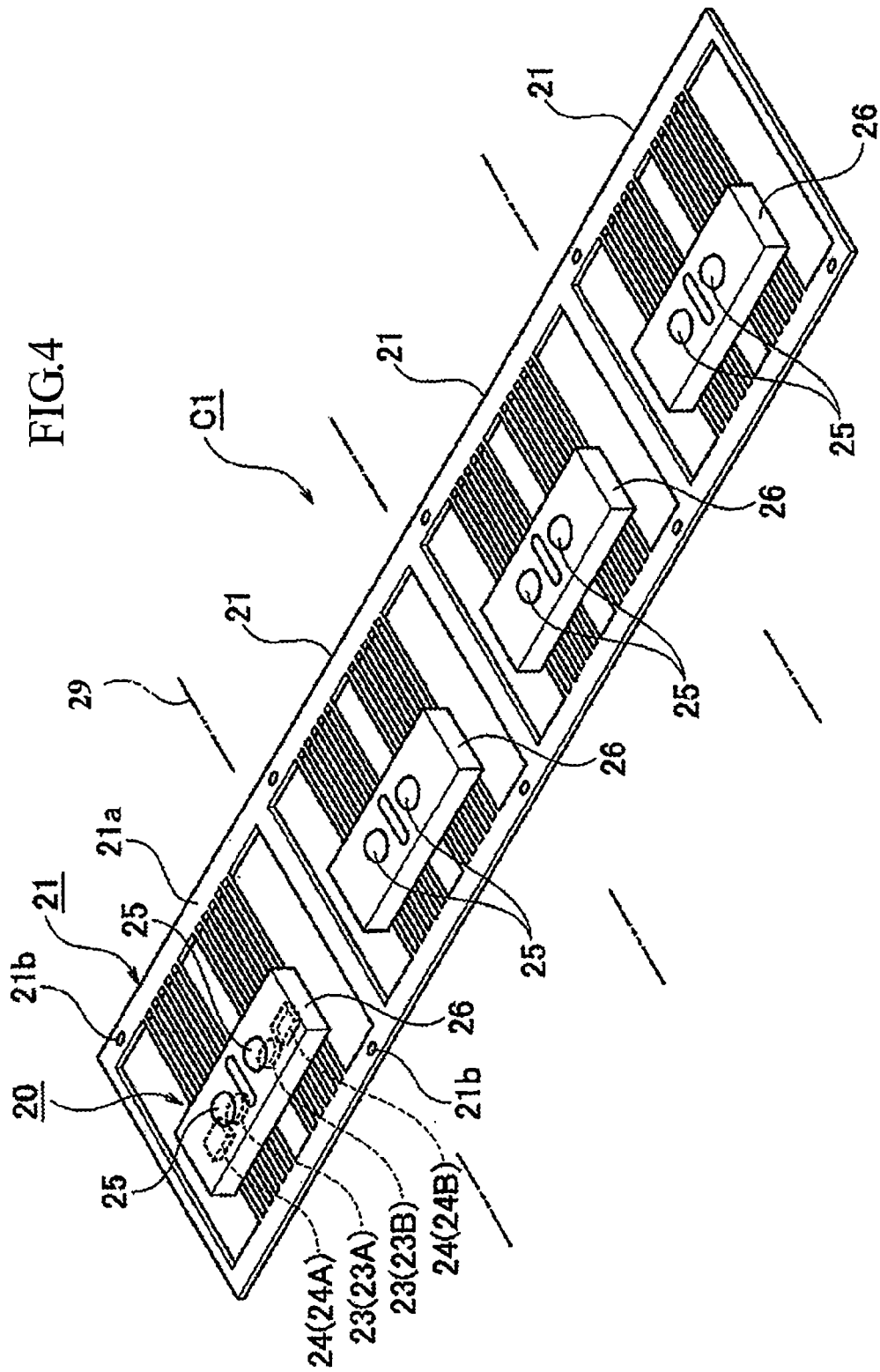
FIG. 4 is a perspective view illustrating a second step in which lenses disposed on front sides of the photoelectric conversion elements with their optical axes aligned with those of the photoelectric conversion elements as well as resin cases for protecting the photoelectric conversion elements and the element driving ICs are primarily molded from a transparent resin material.
Figure 5:
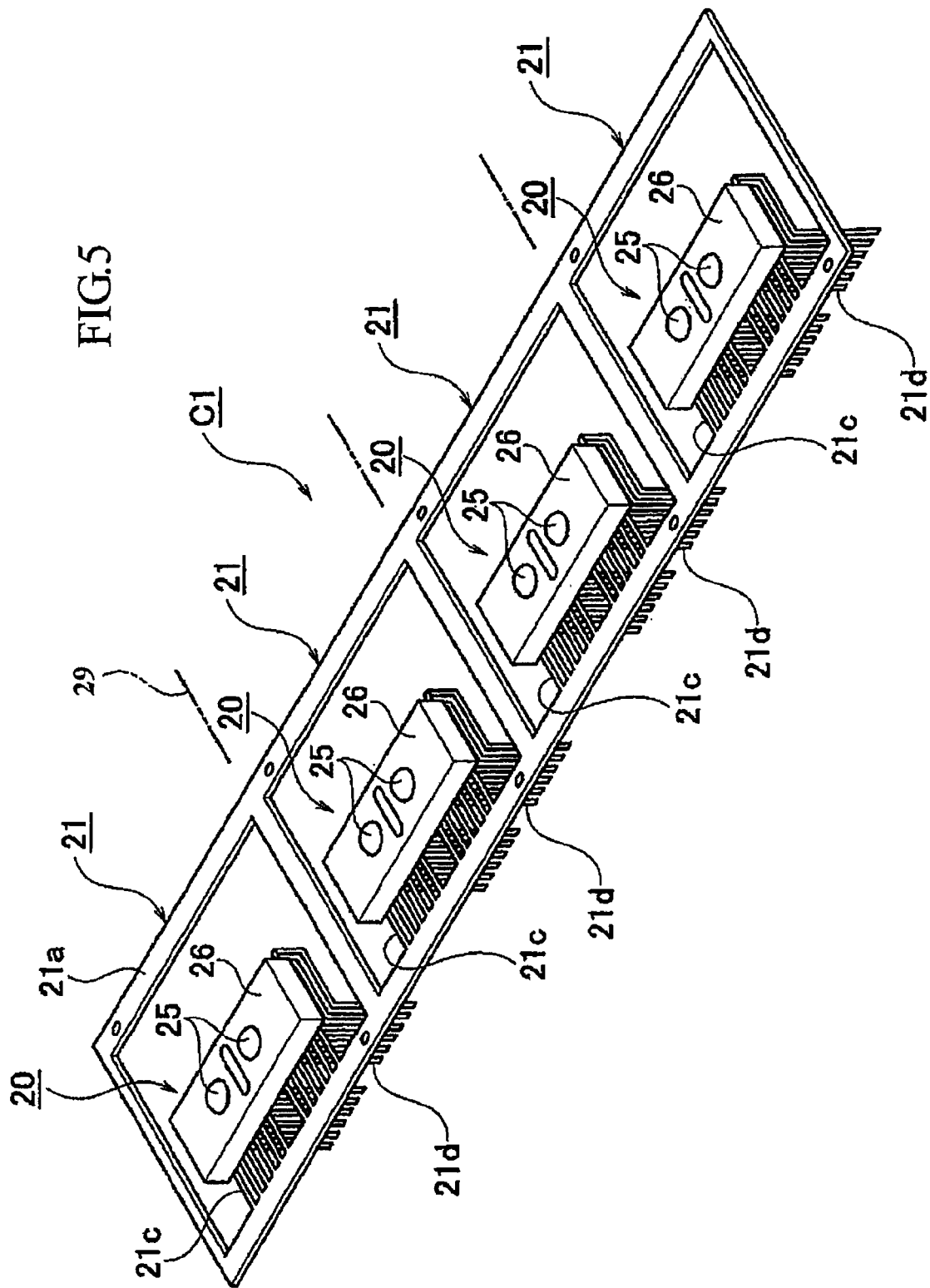
FIG. 5 is a perspective view of a third step in which after the lenses and each resin case are primarily molded from the transparent resin material, a plurality of lead terminals formed on the other inner side surface of each outer frame portion are cut off from each outer frame portion and are subjected to bending.
Figure 6:
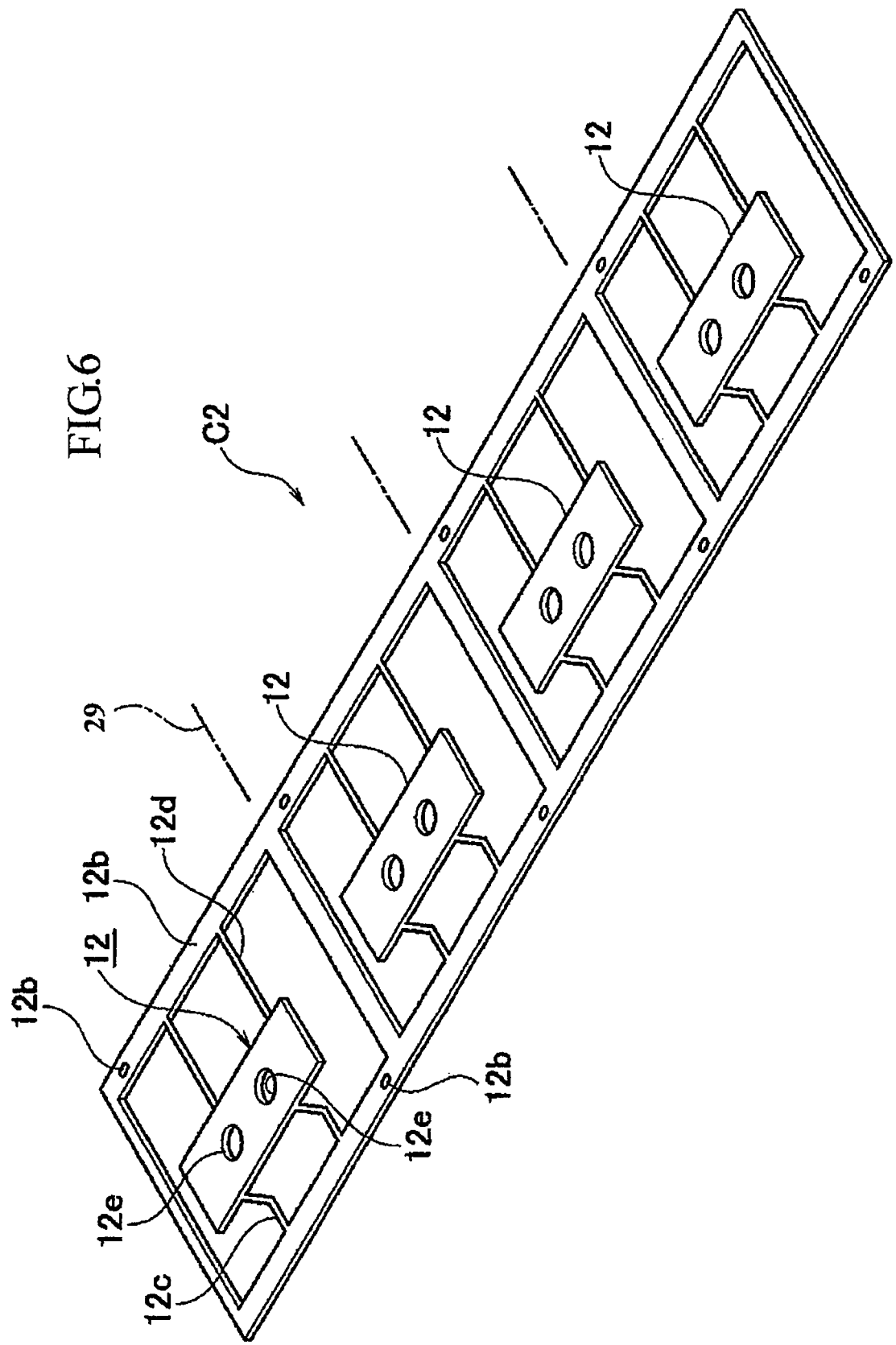
FIG. 6 is a perspective view illustrating a fourth step for forming electromagnetic shield covers.
Figure 7:
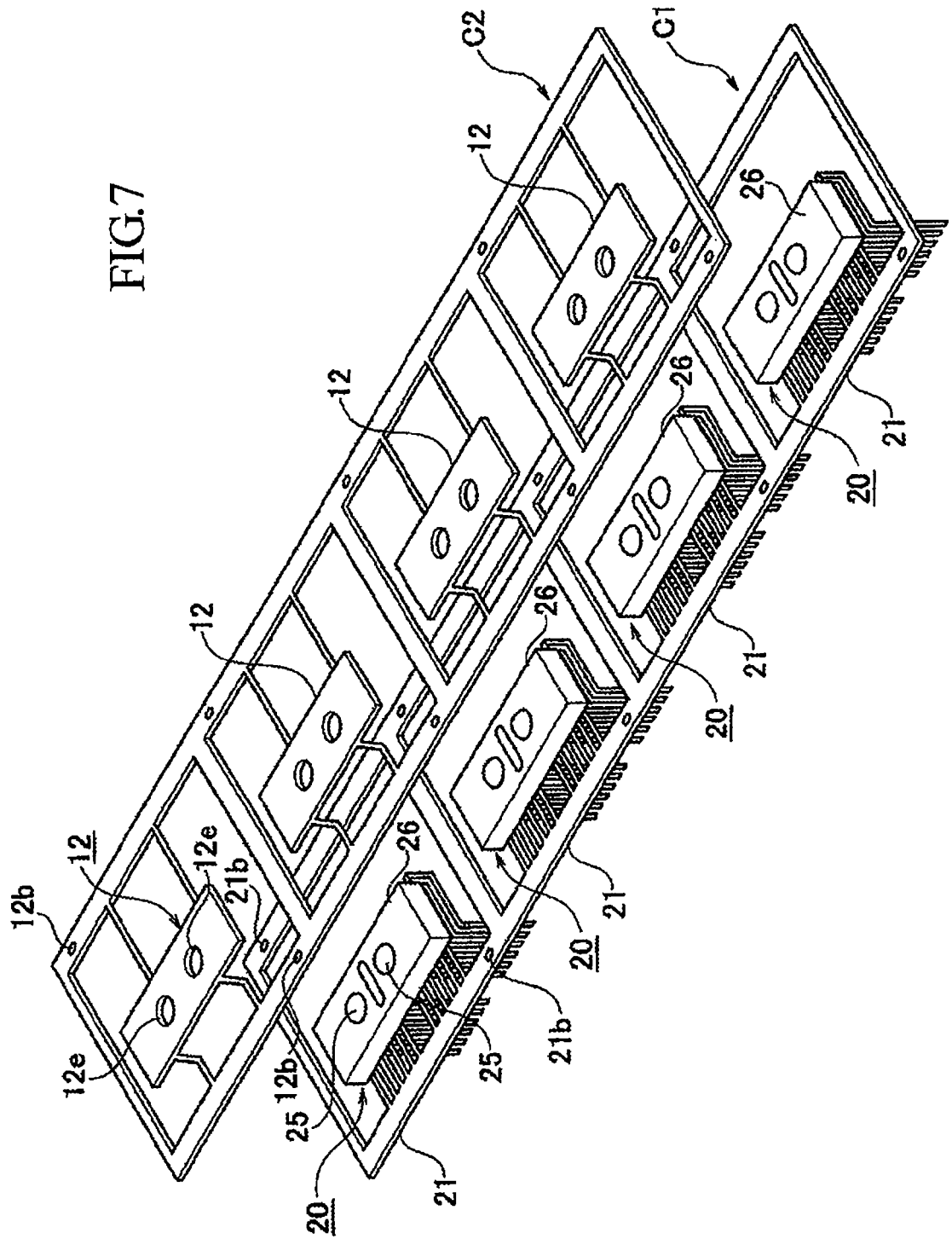
FIG. 7 is a fifth step for superposing each electromagnetic shield cover on the front side of the resin case of each photoelectric conversion element module.
Figure 8:
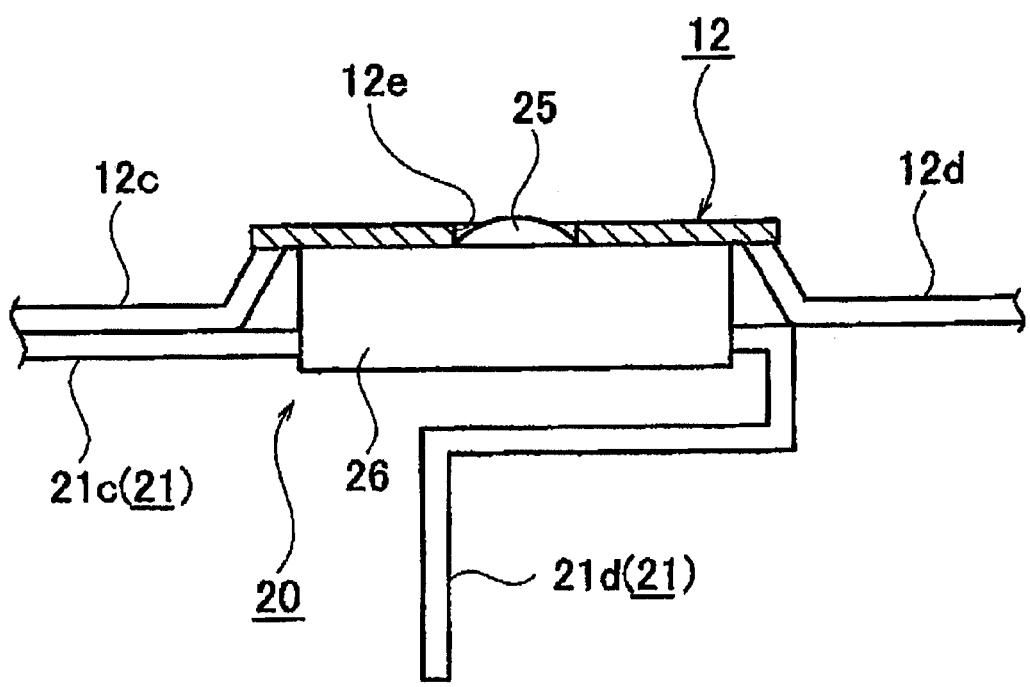
FIG. 8 is a vertical cross-sectional view illustrating in enlarged form a state in which the electromagnetic shield cover is superposed on the front side of the resin case of the photoelectric conversion element module.
Figure 9:
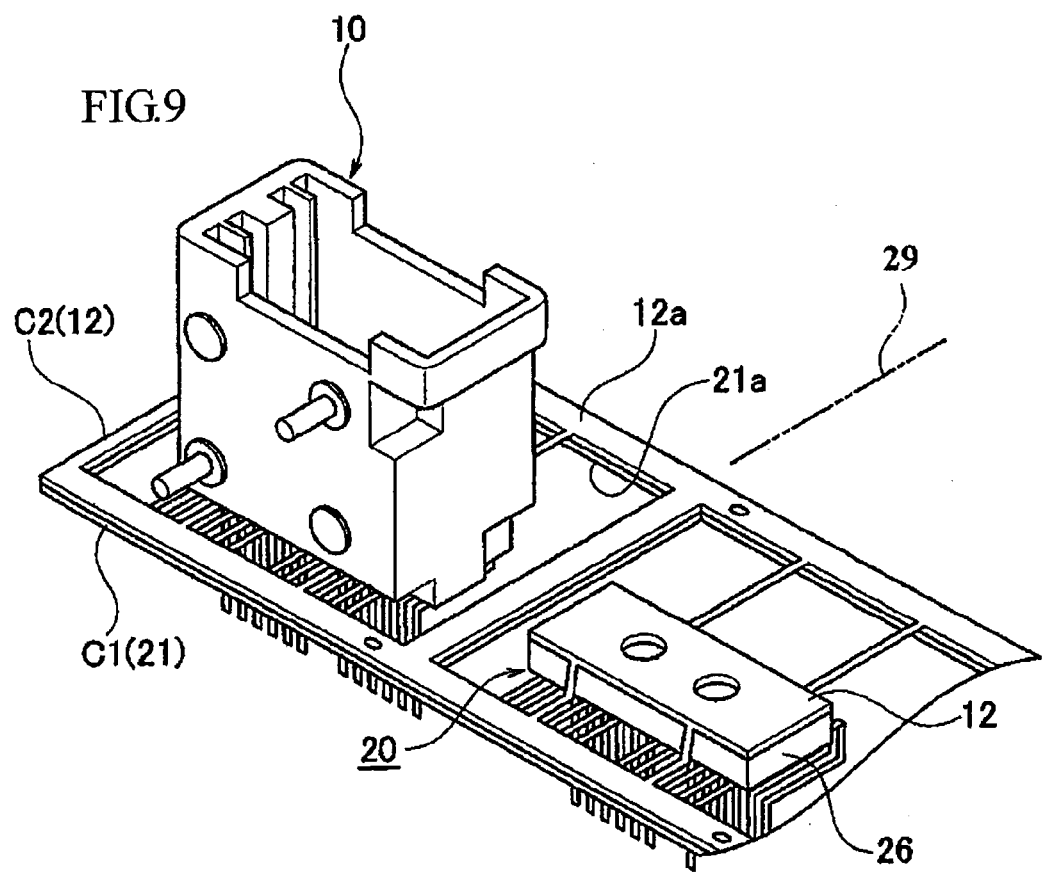
FIG. 9 is a perspective view illustrating a sixth step in which the female optical connector is secondarily molded from a transparent resin material.
Figure 10:
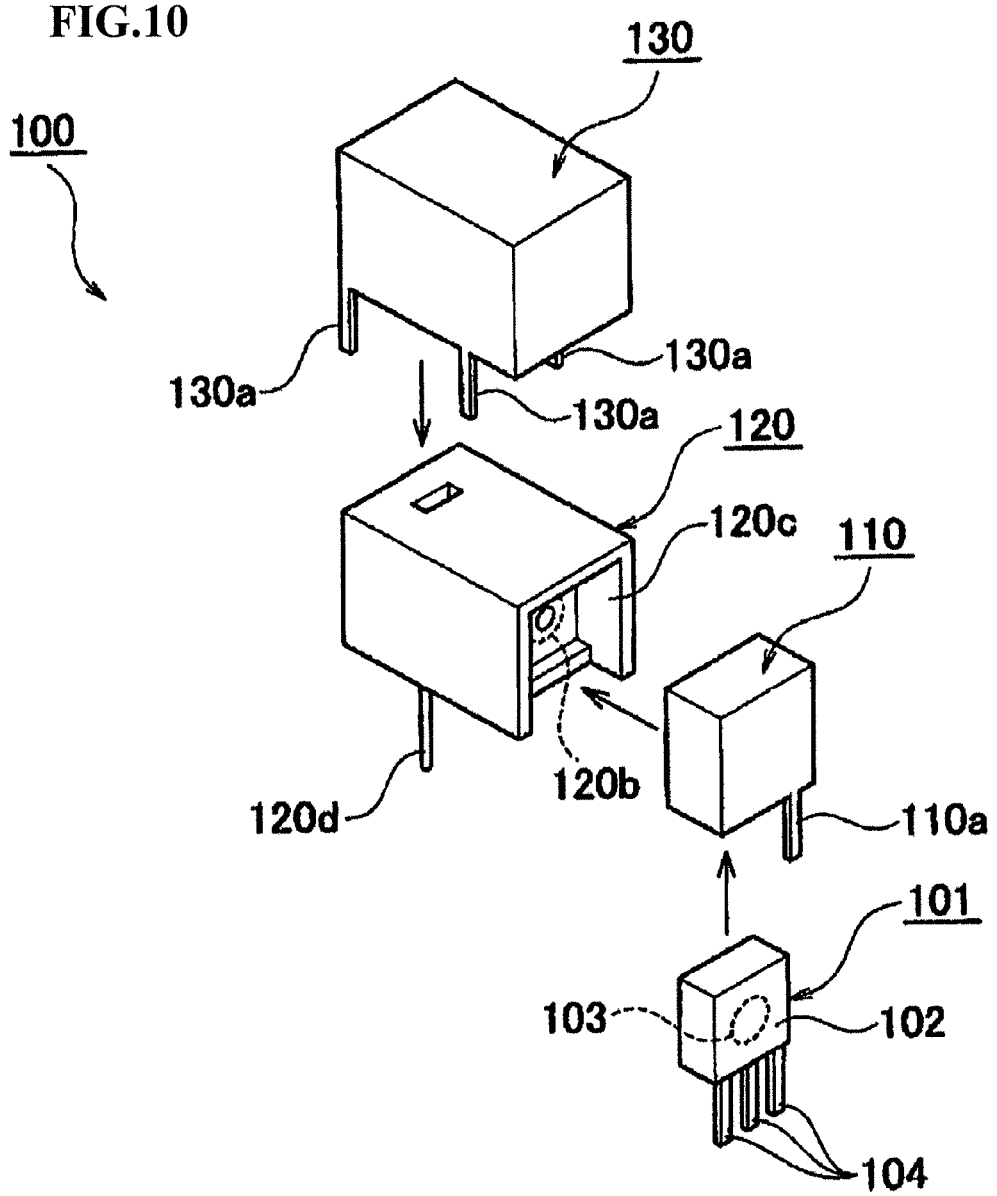
FIG. 10 is an exploded perspective view illustrating a related optical connector.
Figure 11:
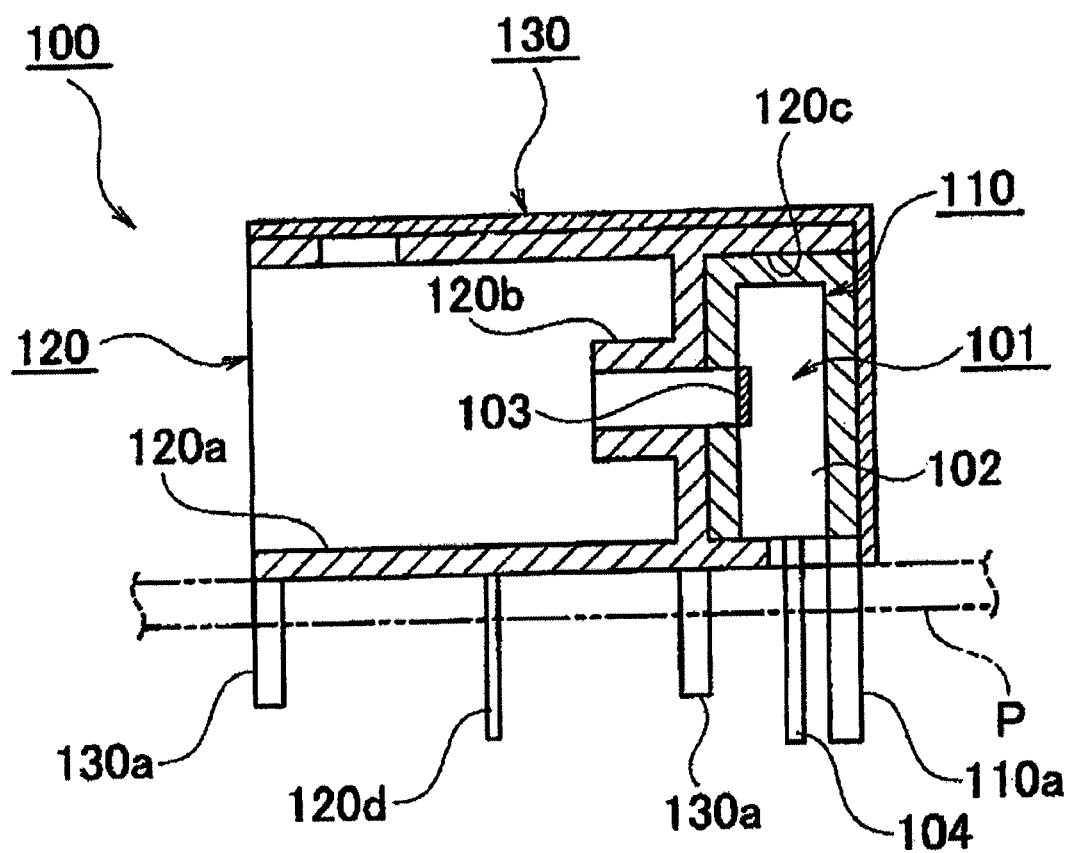
FIG. 11 is a vertical cross-sectional view of the related optical connector.

FIGS. 3A and 3B are perspective views illustrating a first step for mounting the photoelectric conversion elements and the driving ICs on each metal lead frame through the wiring board. FIG. 4 is a perspective view illustrating a second step in which the lenses disposed on the front sides of the photoelectric conversion elements with their optical axes aligned with those of the photoelectric conversion elements as well as the resin casings for protecting the photoelectric conversion elements and the element driving ICs are primarily molded from a transparent resin material. FIG. 5 is a perspective view of a third step in which after the lenses and each resin casing are primarily molded from the transparent resin material, the plurality of lead terminals formed on the other inner side surface of each outer frame portion are cut off from each outer frame portion and are subjected to bending. FIG. 6 is a perspective view illustrating a fourth step for forming the electromagnetic shield covers. FIG. 7 is a fifth step for superposing each electromagnetic shield cover on the front side of the resin casing of each photoelectric conversion element module. FIG. 8 is a vertical cross-sectional view illustrating in enlarged form a state in which the electromagnetic shield cover is superposed on the front side of the resin casing of the photoelectric conversion element module. FIG. 9 is a perspective view illustrating a sixth step in which the female optical connector is secondarily molded from a transparent resin material.

First, in the first step shown in FIGS. 3A and 3B, after an electrically conductive steel plate or a brass plate serving as a first carrier C1 is mounted on an press machine (not shown), a plurality of (e.g., four) metal lead frames 21 are simultaneously punched out in the first molding carrier C1 by press working in such a manner as to be connected in the longitudinal direction.

Here, a description will be given of one of the four metal lead frames 21. In the one metal lead frame 21, an outer frame portion 21a is punched out into a rectangular frame shape, and a pair of guide-pin fitting round holes 21b, into which a pair of guide pins provided in a die of the press machine (not shown) are respectively fitted, are penetratingly bored in upper and lower two diagonal corner portions of this outer frame portion 21a. Further, on one inner side surface, extending along the longitudinal direction of the first molding carrier C1, of the outer frame portion 21a, the plurality of lead terminals 21c with short lengths are formed at predetermined intervals perpendicularly to the longitudinal direction. Also, on the other inner side surface opposing the one inner side surface, the plurality of lead terminals 21d with large lengths are formed at predetermined intervals in such a manner as to oppose the plurality of lead terminals 21c.

In addition, on the pluralities of the lead terminals 21c and 21d formed in the one metal lead frame 21, the set of the light-emitting element 23A and the light-emitting element driving IC 24A and the set of the light-receiving element 2313 and the light-receiving element driving IC 24B are mounted in a wire bonded state at a predetermined interval therebetween along the longitudinal direction of the first molding carrier C1.

Further, in this step, the respective metal lead frames 21 remain connected along the longitudinal direction without being cut along cutting lines 29 indicated by the two-dot chain lines.

Next, in the second step shown in FIG. 4, the state in which the photoelectric conversion elements 23 (23A and 23B) and the element driving ICs 24 (24A and 24B) are mounted on the respective metal lead frames 21 with the four metal lead frames 21 connected in the first molding carrier C1 is handled as a work. This work is set in a mold of an injection molding machine (not shown), and is positioned by inserting the guide pins provided in the mold into the guide-pin fitting round holes 21b formed in the outer frame portion 21a of each metal lead frame 21b.

Then, in the mold of the injection molding machine (not shown), the lenses 25 disposed on the front sides of the photoelectric conversion elements 23 (23A and 23B) with their optical axes K aligned with those of the photoelectric conversion elements 23 (23A and 23B) as well as the resin casings 26 for protecting the photoelectric conversion elements 23 (23A and 23B) and the element driving ICs 24 (24A and 24B) are primarily molded from a transparent resin material.

In this step as well, the respective metal lead frames 21 remain connected along the longitudinal direction without being cut along cutting lines 29 indicated by the two-dot chain lines.

Next, in the third step shown in FIG. 5, after the lenses 25 and each resin case 26 are primarily molded from the transparent resin material on the first molding carrier C1, the plurality of lead terminals 21d formed on the other inner side surface of each outer frame portion 21a are cut off from each outer frame portion 21a in the state in which the plurality of lead terminals 21c formed on the one inner side surface of each metal lead frame 21 remain connected to the outer frame portion 21a. These lead terminals 21d are bent toward the plurality of lead terminals 21c formed on the one inner side surface, and then the respective leading end portions of the lead terminals 21d are further bent downward.

Accordingly, the four photoelectric conversion element modules 20 are formed simultaneously in this step, but here as well the respective metal lead frames 21 remain connected along the longitudinal direction without being cut along cutting lines 29 indicated by the two-dot chain lines.

Next, in the fourth step shown in FIG. 6, after an electrically conductive metal plate serving as a second carrier C2 is mounted on an press machine (not shown), the plurality of (e.g., four) electromagnetic shield covers 12 are simultaneously punched out in the second molding carrier C2 by press working in such a manner as to be connected in the longitudinal direction.

At this juncture, the second molding carrier C2 for forming the four electromagnetic shield covers 12 are set with the same overall size as that of the first molding carrier C1 since the second molding carrier C2 is superposed on the first molding carrier C1 with the four metal lead frames 21 formed thereon, as will be described later.

Here, a description will be given of one of the four electromagnetic shield covers 12. In the one electromagnetic shield cover 12, an outer frame portion 12a is punched out into a rectangular frame shape with the same shape as that of the outer frame portion 21a of the metal lead frame 21, and a pair of guide-pin fitting round holes 12b, into which the pair of guide pins provided in the die of the press machine (not shown) are respectively fitted, are penetratingly bored in upper and lower two diagonal corner portions of this outer frame portion 12a at the same positions as those of the guide-pin fitting round holes 21h formed in the metal lead frame 21. Further, on one inner side surface, extending along the longitudinal direction of the second molding carrier C2, of the outer frame portion 12a, the two lead terminals 12c with short lengths are formed at a predetermined interval therebetween perpendicularly to the longitudinal direction. Also, on the other inner side surface opposing the one inner side surface, the two lead terminals 12d with large lengths are formed at a predetermined interval therebetween in such a manner as to oppose the two terminals 12c. Further, one electromagnetic shield cover 12 is formed in a rectangular shape between the two terminals 12c and the two terminals d.

At this juncture, one electromagnetic shield cover 12 is formed with such an overall size that the electromagnetic shield cover 12 is capable of covering the front surface of the resin casing 26 of the photoelectric conversion element module 20 obtained in FIG. 5, and the two light transmitting holes 12e for facing the two lenses 25 (FIG. 5) are penetratingly formed in each electromagnetic shield cover 12.

In this step as well, the respective electromagnetic shield covers 12 remain connected along the longitudinal direction without being cut along cutting lines 29 indicated by the two-dot chain lines.

It should be noted that the step of forming the electromagnetic shield covers 12 need not necessarily be carried out in this fourth step, and may be carried out in advance.

Next, in the fifth step shown in FIG. 7, the second molding carrier C2 (12) with the four electromagnetic shield covers 12 formed therein is superposed on the first molding carrier C1 (21) holding the four photoelectric conversion element modules 20 set in the mold of the injection molding machine (not shown) such that the guide pins provided in the mold (not shown) are fitted in the guide-pin fitting round holes 21b in the respective outer frame portions 21a so as to effect the positioning of the both carriers C1 and C2. In this state, in the mold of the injection molding machine (not shown), each electromagnetic shield cover 12 covers the front surface of the resin case 26 of each photoelectric conversion element module 20 with the lenses 25 facing the interiors of the light transmitting holes 12e, as also shown in FIG. 8 in enlarged form.

Next, in the sixth step shown in FIG. 9, in the state in which the second molding carrier C2 (12) is superposed on the first molding carrier C1 (21) in the mold of the injection molding machine (not shown) in the fifth step, the female optical connector 10 is secondarily molded from a transparent resin material. The female optical connector 10 is thereby obtained in a state in which the electromagnetic shield cover 12 and the photoelectric conversion element module 20 are embedded therein, and the female optical connector 10 is connected to the respective outer frame portions 21a and 12a of the both molding carriers C1 and C2. Subsequently, the respective outer frame portions 21a and 12a of the both molding carriers C1 and C2 are cut, thereby making it possible to obtain the female optical connector 10 in accordance with the invention described earlier with reference to FIGS. 1 to 2C.

At this juncture, it suffices if either method is adopted between the method in which the four female optical connectors 10 are secondarily molded simultaneously and the method in which after the respective outer frame portions 21a and 12a are cut off in advance one by one from the first and second molding carriers C1 and C2 along the cutting lines 29, the respective one outer frame portions 21a and 12a are superposed in the mold of the injection molding machine (not shown), and the female optical connectors 10 are secondarily molded one by one.

Industrial Applicability

According to the female optical connector and the method of manufacturing a female optical connector in accordance with the invention, it is possible to substantially reduce the assembling man hour of the female optical connector, thereby making it possible to contribute to the improvement of productivity.

While the present invention has been shown and described with reference to certain exemplary embodiments thereof, it will be understood by those skilled in the art that various changes in form and details may be made therein without departing from the spirit and scope of the invention as defined by the appended claims.

This application claims priority from Japanese Patent Application No. 2008-196284 filed on Jul. 30, 2008, the entire subject matter of which is incorporated herein by reference.

Reference Signs List

1: male optical connector
2: plug housing
2a: guide portion with a recessed and projecting pattern
3: optical cable
10: female optical connector
11: receptacle housing
11a: opening
11b: guide portion with a recessed and projecting pattern
11c: light transmitting hole
11d: partition wall
11e: positioning boss
12: electromagnetic shield cover
12a: outer frame portion
12b: guide-pin fitting round hole
12c, 12d: terminals
12e: light transmitting hole
21: metal lead frame
21a: outer frame portion
21b: guide-pin fitting round hole
21c, 21d: lead terminals
22: wiring board
23: photoelectric conversion element
23A: light-emitting element
23B: light-receiving element
24: element driving IC
24A: light-emitting element driving IC
24B: light-receiving element driving IC
25: lens
26: resin case
C1, C2: first and second molding carriers
K: optical axis of the photoelectric conversion element
P: printed wiring board

The invention claimed is:

1. An optical connector comprising:
   a housing including a bottom wall, a plurality of side walls each of which stands from the bottom wall, and an opening defined by the side walls;
   a metal lead provided at the bottom wall;
   a photoelectric conversion element mounted on the metal lead;
   a resin case covering the photoelectric conversion element;
   a lens corresponding to the photoelectric conversion element and provided on the resin case; and
   an electrically conductive metal plate for electromagnetic shielding,
      wherein the electrically conductive metal plate is provided on a face of the resin case where the lens is provided and includes a first through hole into which the lens projects.

2. The optical connector according to claim 1, wherein the housing includes a partition wall which is parallel to the bottom wall, said partition wall having a second through hole corresponding to the first through hole.

3. The optical connector according to claim 2, wherein the electrically conductive metal plate is sandwiched by the resin case and the partition wall.

4. The optical connector according to claim 1, wherein the lens and resin case are integrally formed from a transparent resin.

5. The optical connector according to claim 1, wherein the photoelectric conversion element is at least one of a light-emitting element and a light-receiving element.

6. The optical connector according to claim 1, wherein an optical axis of the photoelectric conversion element and an optical axis of the lens are identical.

7. The optical connector according to claim 2, wherein the first through hole and the second through hole have the same shape.

8. The optical connector according to claim 1, wherein at least one of the plurality of the side walls has a guide portion of a recessed and projecting pattern.

9. The optical connector according to claim 1, wherein the resin case and the lens are primarily molded and the housing is secondly molded.

10. A method for manufacturing an optical connector comprising steps of:
    mounting a photoelectric conversion element on a metal lead frame;
    obtaining a photoelectric conversion module by molding a resin case for covering the photoelectric conversion element and a lens having an optical axis which is aligned with an optical axis of the photoelectric conversion element from a transparent resin;
    mounting an electrically conductive metal plate for electromagnetic shielding, which includes a first through hole into which the lens projects, on a face of the resin case on which the lens is provided; and
    forming a resin housing so as to bury the photoelectric conversion module therein.

11. The method for manufacturing an optical connector according to claim 10, wherein
    the photoelectric conversion element is at least one of a light-emitting element and a light-receiving element.

12. The optical connector according to claim 1, wherein the electrically conductive metal plate is formed in a size capable of covering the face of the resin case.

13. The optical connector according to claim 1, wherein the photoelectric conversion element includes a light-emitting element and a light receiving element.

14. The method for manufacturing an optical connector according to claim 10, further comprising:
    preparing the electrically conductive metal plate having a size capable of covering the face of the resin case.

15. The method for manufacturing an optical connector according to claim 10, further comprising:
    preparing the photoelectric conversion element including a light-emitting element and a light-receiving element.

* * * * *